(12) United States Patent
Popovici et al.

(10) Patent No.: US 11,075,261 B2
(45) Date of Patent: Jul. 27, 2021

(54) STRUCTURE FOR USE IN A METAL-INSULATOR-METAL CAPACITOR

(71) Applicant: IMEC vzw, Leuven (BE)

(72) Inventors: Mihaela Ioana Popovici, Haasrode (BE); Ludovic Goux, Hannut (BE); Gouri Sankar Kar, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/677,309

(22) Filed: Nov. 7, 2019

(65) Prior Publication Data

US 2020/0176554 A1    Jun. 4, 2020

(30) Foreign Application Priority Data

Nov. 30, 2018   (EP) ..................................... 18209406

(51) Int. Cl.
*H01L 49/02*     (2006.01)
*H01L 27/108*    (2006.01)
*H01L 21/02*     (2006.01)
*H01L 21/285*    (2006.01)

(52) U.S. Cl.
CPC .......... *H01L 28/65* (2013.01); *H01L 21/0228* (2013.01); *H01L 21/02186* (2013.01); *H01L 21/28556* (2013.01); *H01L 27/10808* (2013.01)

(58) Field of Classification Search
CPC .............. H01L 28/65; H01L 21/02186; H01L 21/0228; H01L 21/28556; H01L 27/10808
USPC ........................................................ 257/532
See application file for complete search history.

(56) References Cited

U.S. PATENT DOCUMENTS

| 7,939,442 B2 | 5/2011 | Srinivasan et al. |
| 9,343,298 B2 | 5/2016 | Popovici et al. |
| 2004/0195606 A1* | 10/2004 | Basceri ............ H01L 21/76841 257/296 |
| 2010/0072531 A1 | 3/2010 | Kittal et al. |

(Continued)

FOREIGN PATENT DOCUMENTS

| EP | 2434531 A2 | 3/2012 |
| EP | 2434531 A3 | 3/2012 |

OTHER PUBLICATIONS

Ahn et al, "Increment of dielectric properties of SrTiO3 thin films by SrO interlayer on Ru bottom electrodes", Applied Physics Letters 91, 062910 (2007). (Year: 2007).*

(Continued)

*Primary Examiner* — Tong-Ho Kim
(74) *Attorney, Agent, or Firm* — Knobbe, Martens, Olson & Bear LLP

(57) ABSTRACT

The disclosed technology relates to a structure for use in a metal-insulator-metal capacitor. In one aspect, the structure comprises a bottom electrode formed of a Ru layer. The Ru layer has a top surface characterized by a grazing incidence X-ray diffraction spectrum comprising a first intensity and a second intensity, the first intensity corresponding to a diffracting plane of Miller indices (0 0 2) being larger than the second intensity corresponding to a diffracting plane of Miller indices (1 0 1). The structure further comprises an interlayer on the top surface of the Ru layer, the interlayer being formed of an oxide of Sr and Ru having a cubic lattice structure, and a dielectric layer on the interlayer, the dielectric layer being formed of an oxide of Sr and Ti.

20 Claims, 8 Drawing Sheets

(56) References Cited

U.S. PATENT DOCUMENTS

2012/0092807 A1* 4/2012 Popovici .......... H01L 21/02197
361/313

OTHER PUBLICATIONS

Joo et al, "Investigation of ruthenium electrodes for (Br, Sr)TiO3 thin films", Jpn. J. Appl. Phys. vol. 37 (1998) pp. 3396-3401. (Year: 1998).*
Extended European Search Report dated May 24, 2019 for European Patent Application No. 18209406.0 in 8 pages.
Ahn et al., "Increment of dielectric properties of $SrTio_3$ thin films by SrO interlayer on Ru bottom electrodes", Applied Physics Letters, vol. 91, pp. 062910-1-062910-3, 2007.
Joo et al., "Investigation of Ruthenium Electrodes for (Ba, Sr)$TiO_3$ Thin Films", Jpn. J. Appl. Phys., vol. 37, pp. 3396-3401, 1998.
Kupke et al., "Reliability of $SrRuO_3$/$SrTiO_3$/$SrRuO_3$ Stacks for DRAM Applications", IEEE Electron Device Letters, vol. 33, No. 12, Dec. 2012.
Kim et al., "Future of dynamic random-access memory as main memory", M R S Bulletin, vol. 43, No. 5, pp. 334-339, May 2018.
Johnsson et al. "Crystallography and chemistry of perovskites." *Handbook of Magnetism and Advanced Magnetic Materials*, 2007, pp. 1-11.

* cited by examiner

STRUCTURE FOR USE IN A METAL-INSULATOR-METAL CAPACITOR

CROSS-REFERENCE TO RELATED APPLICATIONS

This application claims foreign priority to European Application EP 18209406.0, filed on Nov. 30, 2018, which is incorporated herein by reference in its entirety.

BACKGROUND

Technological Field

The disclosed technology relates to the field of structures for use in metal-insulator-metal capacitors, and to methods of producing the structures.

Description of the Related Technology

Current memory technologies, such as DRAM, SRAM, and NAND Flash, are encountering difficult challenges related to their continued scaling to and beyond the 16 nm generation. DRAM technology is especially challenged as the leakage currents specifications are the most severe. A key role in DRAM technology is played by the metal-insulator-metal (MIM) capacitors. As physical thickness scales down, the conventional $TiN/ZrO_2/Al_2O_3/ZrO_2/TiN$ stack faces huge hurdles to fulfil the requirements of equivalent oxide thickness (EOT) and leakage current density (Jg), which are EOT≤0.4 nm and Jg≤$10^{-7}$ A/cm$^2$ at +/−1V and a dielectric physical thickness ($t_{phys}$) of approximatively 5 nm or lower for the sub-20 nm technology node (S. Kim et al, MRS Bulletin, vol. 43, pp. 334-339, May 2018). On the other hand, these severe EOT and Jg requirements may be reached using the well-known $SrTiO_3$ perovskite, however at the cost of larger $t_{phys}$ of approximatively 10 nm. For example, J. Swerts et al. (IEEE Electron Device Lett. 35, pp. 753-755, July 2014) demonstrated an EOT of 0.40 nm and a Jg of $10^{-7}$ A/cm$^2$ using Ru electrodes and 8.5 nm $SrTiO_3$ showing a dielectric constant k of about 85. However, as the physical thickness of $SrTiO_3$ is downscaled to 5 nm, the drastic increase of leakage prohibits its use as DRAM dielectric, and so far, no solution has been identified to circumvent this roadblock. An alternative solution is to change the capacitor design from the double-sided cup shape (FIGS. 1 (a) and 2 (a)) to a pillar shape (see FIGS. 1 (b) and 2(b)). The strong advantage of this design is that the $SrTiO_3$ physical thickness may be kept in the vicinity of 10 nm for some generations. However, the associated strong drawback is that the effective capacitor area is halved. This implies that in this approach the k-value of $SrTiO_3$ needs to be substantially boosted to compensate for this loss of capacitive signal.

There is therefore a need in the art for new structures for use in a MIM capacitor, the structure comprising a dielectric layer with a larger k-value.

SUMMARY OF CERTAIN INVENTIVE ASPECTS

One objective of some aspects of the disclosed technology is to provide good structures for use in a MIM capacitor, as well as methods of manufacturing the structures.

The above and other objectives are accomplished by disclosing aspects of a method, a structure, and a metal-insulator-metal capacitor according to the disclosed technology.

In a first aspect, the disclosed technology relates to a structure for use in a metal-insulator-metal capacitor, comprising: a bottom electrode, the bottom electrode comprising a Ru layer having a top surface characterized by a grazing incidence X-ray diffraction spectrum having a first intensity corresponding to a diffracting plane of Miller indices (0 0 2), the first intensity being larger than a second intensity corresponding to a diffracting plane of Miller indices (1 0 1); an interlayer on the top surface of the Ru layer, the interlayer comprising an oxide of Sr and Ru (SRO) having a cubic lattice structure; and a dielectric layer on the interlayer, the dielectric layer comprising an oxide of Sr and Ti (STO) having a cubic lattice structure.

The structure of the first aspect can be further characterized by the process used to obtain it. In other words, the disclosed technology may relate to a structure for use in a metal-insulator-metal capacitor, the structure being obtainable by any embodiment of the third aspect. For instance, the structure may be obtainable by: depositing by thermal atomic layer deposition a $TiO_2$ layer on a Ru layer having a top surface characterized by a grazing incidence X-ray diffraction spectrum having a first intensity corresponding to a diffracting plane of Miller indices (0 0 2), the first intensity being larger than a second intensity corresponding to a diffracting plane of Miller indices (1 0 1); depositing on the $TiO_2$ layer, by thermal atomic layer deposition, a first layer of an oxide of Sr and Ti by using a Sr:Ti cycle ratio of between 3:1 and 5:1; performing a first annealing to form the interlayer; depositing on the interlayer, by thermal atomic layer deposition, a second layer of an oxide of Sr and Ti by using a Sr:Ti cycle ratio of between 1.5:1 and 0.5:1; and performing a second annealing to form the dielectric layer.

Furthermore, the Ru layer according to embodiments of the disclosed technology is obtainable by performing a thermal atomic layer deposition (ALD) of Ru on: a TiN layer deposited on a substrate by ALD or plasma enhanced atomic layer deposition (PEALD); or a $SiO_2$ layer.

In a second aspect, the disclosed technology relates to a metal-insulator-metal capacitor, comprising the structure according to any embodiment of the first aspect, and: a top electrode on the dielectric layer, the top electrode comprising a Ru layer and/or a TiN layer.

In a third aspect, the disclosed technology relates to a method of forming the structure according to any embodiment of the first aspect, comprising: depositing by thermal atomic layer deposition a $TiO_2$ layer on a Ru layer having a top surface characterized by a grazing incidence X-ray diffraction spectrum having a first intensity corresponding to a diffracting plane of Miller indices (0 0 2), the first intensity being larger than a second intensity corresponding to a diffracting plane of Miller indices (1 0 1); depositing on the $TiO_2$ layer, by thermal atomic layer deposition, a first layer of an oxide of Sr and Ti by using a Sr:Ti cycle ratio of between 3:1 and 5:1; performing a first annealing to form the interlayer; depositing on the interlayer, by thermal atomic layer deposition, a second layer of an oxide of Sr and Ti by using a Sr:Ti cycle ratio of between 1.5:1 and 0.5:1; and performing a second annealing to form the dielectric layer.

The presence of the Ru layer having a top surface characterized by a grazing incidence X-ray diffraction spectrum having a first intensity corresponding to a diffracting plane of Miller indices (0 0 2), the first intensity being larger than a second intensity corresponding to a diffracting plane of Miller indices (1 0 1) may permit to improve the microstructure of the dielectric layer formed thereon and therefore to improve the overall quality of MIM capacitors containing the same.

In particular, the performance of steps a to c permits the formation of an interlayer comprising an oxide of Sr and Ru having a cubic lattice structure. In other words, it comprises one or more oxides of Sr and Ru, at least one of which having a cubic lattice structure. Without being bound by theory, it is believed that the high quality of the dielectric layer formed on this interlayer is due at least in part to this interlayer having a lattice constant "a" close the lattice constant "a" of the dielectric layer epitaxially grown thereon. It is hypothesised that the interlayer comprises an oxide belonging to the family of strontium ruthenates ($Sr_2RuO_4$, $Sr_3Ru_2O_7$, $SrRuO_3$) having, as a representative member, the cubic oxide $SrRuO_3$ which has an "a" lattice constant equals to 3.910 Å while the dielectric layer would comprise an oxide from the family of strontium titanate perovskites having, as a representative member, the cubic oxide with the formula $SrTiO_3$ which has an "a" lattice constant equals to 3.903 Å, thereby providing a low lattice mismatch of only 0.18%. Although it is not certain that the composition of the oxide of Sr and Ru having a cubic lattice structure has the formula $SrRuO_3$ (it could deviate from this stoichiometry, for instance, it could be Sr deficient and have a Sr/Ru ratio of from 0.38 to 0.50 or from 0.38 to 0.48), a low lattice mismatch is expected. The formation of an SRO oxide of Sr and Ru not only provides an electrode (as this oxide is conductive) but also a template to grow the dielectric layer thereon.

This method has the further advantage of being conformal. Indeed, only thermal atomic layer deposition (ALD) steps (and in some embodiments, plasma-enhanced atomic layer deposition steps (PEALD)) are used. Thermal ALD, and to a lesser extent PEALD, are conformal methods. This means that three-dimensional structures of either the cup-shape type or the pillar-shape type can be obtained by performing the method on, respectively, a cup-shaped substrate or a pillar-shaped substrate.

This method has the further advantage of circumventing the known difficulties existing in forming oxides by a direct chemical reaction between Sr and Ru. Indeed, such oxides are notoriously difficult to grow in good quality by ALD. For instance, Han et al. (ECS Transactions, vol. 58 (1), pp. 171-182, 2013) showed that the lowest resistivity of ~2,300μΩ·cm achieved by a $SrRuO_3$ layer obtained by direct ALD deposition was much larger in comparison to those of sputtered $SrRuO_3$ (~1,000μΩ·cm) and CVD $SrRuO_3$ (~470 μΩ·cm). The extracted k-value of STO grown on their ALD $SrRuO_3$ was only 44, far from the value of 118 obtained in the disclosed technology, indicating a poor interface with the dielectric or not fully crystallized $SrTiO_3$.

In the method of the disclosed technology, the direct ALD growth of $SrRuO_3$ is not attempted but instead, an interlayer comprising an oxide of Sr and Ru having a cubic structure is obtained in situ by annealing together a $TiO_2$ layer, an oxide of Sr and Ti deposited by using an ALD cycle ratio of between 3:1 to 5:1, and a Ru layer having a top surface characterized by a grazing incidence X-ray diffraction spectrum having a first intensity corresponding to a diffracting plane of Miller indices (0 0 2), the first intensity being larger than a second intensity corresponding to a diffracting plane of Miller indices (1 0 1).

It is an advantage of some embodiments of the disclosed technology that the structures have a dielectric layer having a very high k-value in excess of 90 and up to 118 or even more (some preliminary experiments, not described in the present disclosure, have reached values up to 180).

It is an advantage of some embodiments of the disclosed technology that these very high k-values may exist from the bulk to the interface with the interlayer, i.e. in virtually the whole depth of the dielectric.

It is an advantage of some embodiments of the disclosed technology that the structures have a dielectric layer of very high crystalline quality, with a low level of defects, thereby minimizing leakage.

It is an advantage of some embodiments of the disclosed technology that a dielectric thickness lower than 10 nm, even lower than 9 nm, or even lower than 7 nm is achievable while keeping an EOT of 0.40 nm or lower and a Jg of $10^{-7}$ $A/cm^2$ or lower. In particular, such combinations of very low thickness and good EOT and Jg can be achieved by introducing a dopant selected from the group consisting of Ba, La, Ce, Pr, Nd, Pm, Sm, Eu, and Gd in the dielectric layer (e.g. in the first layer of an oxide of Sr and Ti and/or in the second layer of an oxide of Sr and Ti).

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the disclosed technology will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
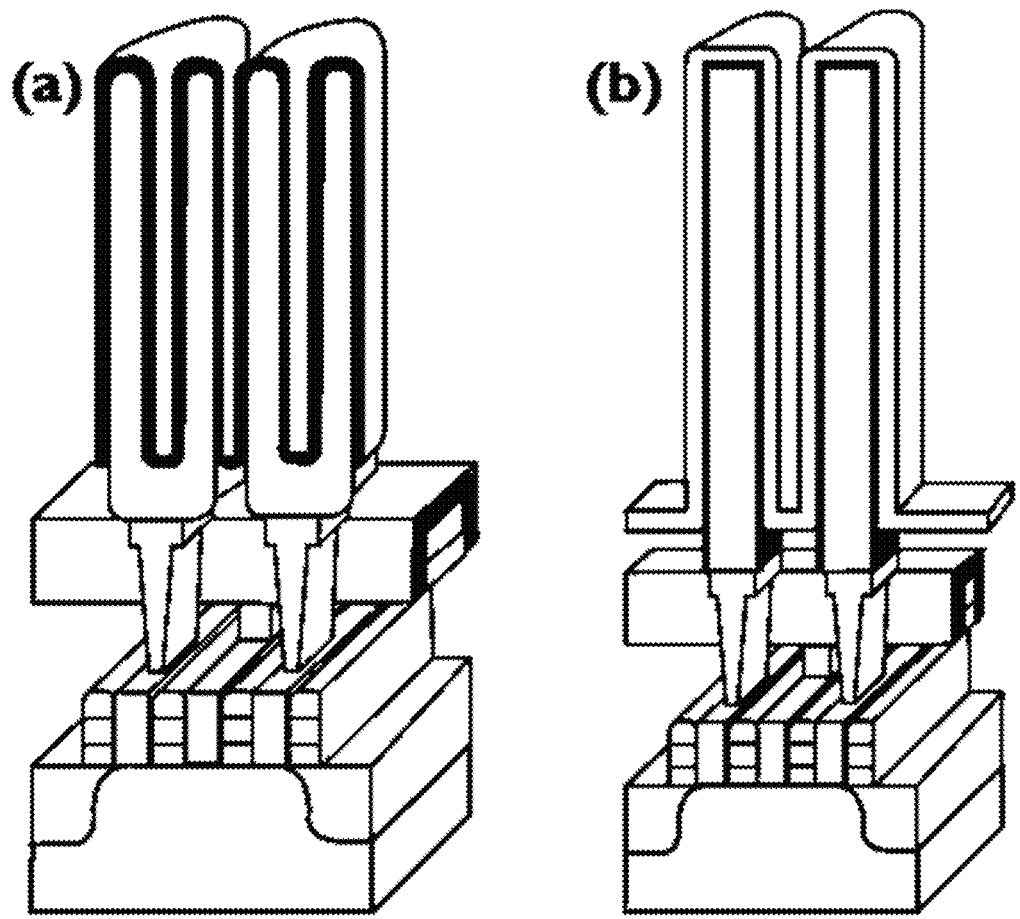
FIG. 1 is a schematic view including a vertical cross-section of double-sided cup-type (a) and pillar-type (b) DRAM capacitor design.

In the different figures, the same reference signs refer to the same or analogous elements.

DETAILED DESCRIPTION OF CERTAIN ILLUSTRATIVE EMBODIMENTS

The disclosed technology will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

In a first aspect, the disclosed technology relates to a structure for use in a metal-insulator-metal capacitor. This structure comprises a bottom electrode and an insulator layer. The bottom electrode comprises a Ru layer.

The Ru layer is typically a polycrystalline metallic layer whose crystallites have an hexagonal lattice structure. The Ru layer according to some embodiments of the disclosed technology has a top surface characterized by a grazing incidence X-ray diffraction spectrum having a first peak corresponding to a diffracting plane of Miller indices (0 0 2), the first peak having a larger intensity than a second peak corresponding to a diffracting plane of Miller indices (1 0 1). The second peak being typically absent or too small to be visible, the Ru layer according to some embodiments of the disclosed technology can be characterized by a grazing incidence X-ray diffraction spectrum having a first intensity corresponding to a diffracting plane of Miller indices (0 0 2), the first intensity being larger than a second intensity corresponding to a diffracting plane of Miller indices (1 0 1). Typically, the first intensity can be measured at 42,2° while the second intensity can be measured at 44,0°. This characteristic of the Ru layer is indicative that the Ru grew preferentially in the [001] direction and that the crystallites in the Ru layer have an average orientation of their (0 0 2) plane closer to be parallel to the top surface of the Ru layer than to be perpendicular therewith. This characteristic is advantageous as it permits the formation of an insulator layer of particularly high quality.

To determine the relative magnitude of the (0 0 2) intensity (or peak) and of the (1 0 1) intensity (or peak), a first GIXRD spectrum may be taken for the top surface of the substrate on which the Ru layer will be grown. This top surface can, for instance, be the top surface of a TiN layer. A second GIXRD spectrum may be taken for the assembly substrate/Ru after that Ru has been grown on the substrate but before the deposition of any further layer thereon; both spectra are normalized, for instance by setting to a same intensity a peak characteristic of the substrate; subtracting the first spectrum from the second spectrum; and comparing the first intensity corresponding to a diffracting plane of Miller indices (0 0 2) with the second intensity corresponding to a diffracting plane of Miller indices (1 0 1).

Insulator layers grown on Ru layers according to the prior art characterized by a grazing incidence X-ray diffraction spectrum having a first peak corresponding to a diffracting plane of Miller indices (0 0 2), the first peak having a lower intensity than a second peak corresponding to a diffracting plane of Miller indices (1 0 1), do not permit the formation of an insulator layer of such a high quality. In particular, the Ru layers according to the disclosed technology permit the formation of an insulator layer having a dielectric constant (k-value) of up to 118 for only up to 85 in the case of an insulator layer formed on a Ru layer according to the prior art (where PVD TiN underlayer having an internal compressive strain was used). In the case of using ALD or PEALD TiN having internal tensile strain as deposited, the growth of Ru along (0 0 2) direction takes place.

The Ru layer according to some embodiments of the disclosed technology is obtainable by performing a thermal atomic layer deposition (ALD) of Ru on:
 a TiN layer deposited on a substrate (e.g. a Si wafer) by ALD or plasma enhanced atomic layer deposition (PEALD), or
 a $SiO_2$ layer.

The ALD of Ru operates by reacting a Ru precursor (e.g ethyl-benzene ethyl-1,4-cyclohexadiene ruthenium) and an oxidant (e.g $O_2$) on either the TiN or the $SiO_2$ underlayer.

It has been observed within the disclosed technology that some substrates promote the formation of a Ru layer according to the disclosed technology while others do not. In particular, while ALD-deposited TiN, PEALD-deposited TiN, or $SiO_2$ promotes the formation of a Ru layer according to the disclosed technology, other substrates such as PVD-deposited TiN do not. TiN deposited by ALD or PEALD typically have internal tensile strain. TiN deposited by PVD typically have internal compressive strain. In some embodiments, the Ru layer of the disclosed technology is obtainable by performing a thermal atomic layer deposition (ALD) of Ru on a TiN layer having internal tensile strain.

Without being bound by theory, it is believed that the type of strain in the TiN layer (tensile or compressive) determines the orientation of the Ru growth.

In some embodiments of the disclosed technology, the structure may therefore further comprise a TiN layer or a $SiO_2$ layer, on which the Ru layer is present. The TiN layer is obtainable by an ALD or PEALD deposition.

In some embodiments, the Ru layer may have a thickness of from 2 to 10 nm, such as from 3 to 7 nm or from 4 to 6 nm.

When the Ru layer is formed on a TiN layer, the TiN layer forms part of the bottom electrode.

The TiN layer is typically itself on a substrate. Suitable substrates are semiconductor substrates such as group IV substrates (Si, Ge, SiGe, Silicon-on-insulator, Germanium-on-insulator) or a group III-V substrate. The substrate may be Si (e.g. a Si wafer). A typical substrate is n-doped Si.

The $SiO_2$ layer is typically itself on a substrate. The substrate may be Si (e.g. a Si wafer). A typical substrate is n-doped Si.

In some embodiments, the substrate may have one or more portion having a concave shape, thereby enabling the formation of a cup-shaped MIM capacitor.

In other embodiments, the substrate may have one more portions having a convex shape (e.g. the shape of a pillar), thereby enabling the formation of a pillar-shaped MIM capacitor.

The insulator formed on the Ru layer of the disclosed technology is obtainable by, for example, a method comprising the steps of:
 a. depositing by thermal atomic layer deposition a $TiO_2$ layer on a Ru layer having a top surface characterized by a grazing incidence X-ray diffraction spectrum having a first intensity corresponding to a diffracting plane of Miller indices (0 0 2), the first intensity being larger than a second intensity corresponding to a diffracting plane of Miller indices (1 0 1),
 b. depositing on the $TiO_2$ layer, by ALD, a first layer of an oxide of Sr and Ti by using a Sr:Ti cycle ratio of between 3:1 and 5:1;
 c. performing a first annealing to form the interlayer;
 d. depositing on the interlayer, by ALD, a second layer of an oxide of Sr and Ti by using a Sr:Ti cycle ratio of between 1.5:1 and 0.5:1; and
 e. performing a second annealing to form the dielectric layer.

These steps will be detailed in the second aspect of the disclosed technology which relates to the method itself.

The result of this method is the formation on the Ru layer of an insulator layer comprising a transition layer located at the top surface of the Ru layer and at the bottom of the dielectric layer by partial Sr and Ru intermixing. This transition layer is referred herein as an interlayer.

In some embodiments, a metal dopant may be introduced during step b and/or step d. This can be achieved by interjecting up to 5 ALD deposition cycles (per layer of an oxide of Sr and Ti) of a metal oxide dopant selected from oxides of Ba, La, Ce, Pr, Nd, Pm, Sm, Eu and Gd during the deposition of the first and/or the second layer of an oxide of Sr and Ti. By "interjecting", it is meant that the deposition of the first or of the second layer is interrupted one or more times before to resume the deposition of the first or second layer, each time in order to perform one or more ALD deposition cycles (in the present case, of a metal oxide dopant).

The interlayer comprises an oxide of Sr and Ru having a cubic lattice structure. In other words, it comprises one or more oxides of Sr and Ru, at least one of which having a cubic lattice structure. In some embodiments, the GIXRD diagram of the structure shows the signature of the presence of cubic $SrRuO_3$. In some embodiments, the GIXRD diagram of the structure shows the signature of a comparatively large amount of cubic $SrRuO_3$ and of a comparatively small amount of other oxides of Sr and Ru. A Rietveld refinement fit analysis with Rwp (%)=3.95% and sigma=0.87 indicated a comparatively large amount of cubic $SrRuO_3$ and a comparatively small amount of tetragonal $Sr_3Ru_2O_7$. Another fit model having a better match to the experimental data (Rwp %=3.13% and sigma=0.69) indicates the possible presence of trigonal $SrRu_2O_6$ and monoclinic $Sr_2Ru_3O_{10}$ next to the cubic $SrRuO_3$. This data fit is more plausible and indicate a gradual transition from hexagonal Ru towards cubic $SrRuO_3$ with two intermediate phases also present and having the ratio Sr:Ru=1:2 and Sr:Ru=1:1.5 and in agreement with the gradual decrease in density observed starting from Ru bottom layer and towards the top surface layer due to the partial intermixing of Ru (high density element) with a lower density element (Sr) within the interlayer. The interlayer typically has a thickness of less than 2 nm, or even less than 1 nm as it is too thin to be observed on TEM pictures.

The dielectric layer comprises an oxide of Sr and Ti. This oxide typically has a cubic lattice structure.

In some embodiments, the dielectric layer may have an Sr/Ti atomic ratio ranging from 40 to 51%, from 43 to 50%, or from 44 to 48%.

In some embodiments, the thickness of the dielectric layer may be of 20 nm or lower, 16 nm or lower, or 12 nm or lower. For instance, it may be from 5 nm to 20 nm, from 5 nm to 16 nm, or from 5 nm to 12 nm. Such a low thickness is possible due to the very high quality and hence the very high k-values and the low leakage displayed by the dielectric layer. The lowest thicknesses may be used when the dielectric layers are doped.

In some embodiments, the dielectric layer may have a k-value above 90, above 100, above 110, or above 115. That such high k-value can be achieved is one of the advantages of the disclosed technology.

In some embodiments, the dielectric layer may comprise one or more dopants selected from the group consisting of Ba, La, Ce, Pr, Nd, Pm, Sm, Eu, and Gd. In some embodiments, the one or more dopants are selected from Ba, and Pr. This is advantageous as it reduces leakage and enables smaller thicknesses.

Any features of the first aspect may be as correspondingly described in the other aspects of the disclosed technology.

In a second aspect, the disclosed technology relates to a metal-insulator-metal capacitor, comprising the structure according to any embodiment of the first aspect, and:
iv. a top electrode on the dielectric layer, the top electrode comprising a Ru layer and/or a TiN layer.

In some embodiments, this top Ru layer and/or top TiN layer can be provided by the same methods used to provide the bottom Ru layer and/or TiN layer.

In some embodiments, the metal-insulator-metal capacitor may be a pillar-type dynamic random-access memory capacitor.

Any feature of the second aspect may be as correspondingly described in the other aspects of the disclosed technology.

In a third aspect, the disclosed technology relates to a method of forming the structure according to any embodiment of the first aspect, the method comprising:
a. depositing by thermal atomic layer deposition a $TiO_2$ layer on a Ru layer having a top surface characterized by a grazing incidence X-ray diffraction spectrum having a first intensity corresponding to a diffracting plane of Miller indices (0 0 2), the first intensity being larger than a second intensity corresponding to a diffracting plane of Miller indices (1 0 1),
b. depositing on the $TiO_2$ layer, by thermal atomic layer deposition, a first layer of an oxide of Sr and Ti by using a Sr:Ti cycle ratio of between 3:1 and 5:1 (e.g. with or without a metal dopant amounting to maximum 5 cycles of dopant metal oxide, where the dopant metal element could be Ba, La, Ce, Pr, Nd, Pm, Sm, Eu or Gd);
c. performing a first annealing to form the interlayer;
d. depositing on the interlayer, by thermal atomic layer deposition, a second layer of an oxide of Sr and Ti by using a Sr:Ti cycle ratio of between 1.5:1 and 0.5:1 (e.g. with or without a metal dopant amounting to maximum 5 cycles of dopant metal oxide, where the dopant metal element could be Ba, La, Ce, Pr, Nd, Pm, Sm, Eu or Gd); and
e. performing a second annealing to form the dielectric layer.

Step a of depositing by ALD a $TiO_2$ layer on a Ru layer operates as follows: In some embodiments, a Ti precursor (e.g. Ti (IV) methoxide) is reacted with an oxidant (e.g. water) on the Ru layer. The Ru layer may be obtained, for example, from the reaction of (Ethylbenzyl) (1-Ethyl-1,4-cyclohexadienyl) Ru, EBECHRu, and $O_2$ as oxidant, according to some embodiments of the disclosed technology.

In some embodiments, the thickness of the $TiO_2$ layer may be between 0.3 and 0.4 nm. This can correspond to the range between 6 and 10 cycles Ti precursor/oxidant (e.g. 8 cycles).

Step b of depositing a first layer of an oxide of Sr and Ti may operate as follows: In some embodiments, a series of one or more Sr cycles, each Sr cycle being composed of a Sr precursor pulse followed by reaction with an oxidant, is performed. This series of Sr cycles is followed by a series of one or more Ti cycles, each Ti cycle being composed of a Ti precursor pulses followed by reaction with an oxidant. The combination of the series of one or more Sr cycles followed by the series of one or more Ti cycles corresponds to one super-cycle of STO. The ratio between the number of first Sr cycles and the number of Ti cycles is from 3:1 to 5:1.

An example of suitable Sr precursor is strontium-bis(tris-butylcyclopentadienyl), $Sr(^tBu_3CP)_2$. An example of suitable Ti precursor is Ti(IV) methoxide ($Ti(OCH_3)_4$). A typical oxidant is water.

The deposition temperature during step b may range from 100 to 400° C., from 150 to 350° C., or from 200 to 300° C.

In some embodiments, the thickness of the first layer of an oxide of Sr and Ti may be ranging from 0.5 to 3 nm, or from 0.6 to 2 nm. Here, 11 to 14 super-cycles of STO may be used.

Step c of performing a first annealing may be a rapid thermal annealing step. Step c of performing a first annealing may be performed at a temperature ranging from 500 to 900° C., from 600 to 800° C., or from 650 to 750° C. The duration of step c may be ranging from 0.5 second to 10 seconds, or from 1 second to 4 seconds. The ambient pressure during step c is may be 1 atm. The atmosphere is may be an inert atmosphere, such as a $N_2$ or Ar atmosphere.

In some embodiments, step c may be performed at a temperature of from 650 to 750° C., for a duration of from 1 to 4 seconds, at a pressure of 1 atm, under an inert atmosphere.

A result of step c is the formation of the interlayer described above.

Step d of depositing a second layer of an oxide of Sr and Ti may operate as follows: In some embodiments, a series of one or more Sr cycles, each Sr cycle being composed of a Sr precursor pulse followed by reaction with an oxidant, is performed. This series of Sr cycles is followed by a series of one or more Ti cycles, each Ti cycle being composed of a Ti precursor pulses followed by reaction with an oxidant. The combination of the series of one or more Sr cycles followed by the series of one or more Ti cycles corresponds to one super-cycle of STO. The ratio between the number of first cycles (i.e. Sr cycles) and the number of second cycles (i.e. Ti cycles) is from 1.5:1 to 0.5:1.

An example of suitable Sr precursor is $Sr(^tBu_3CP)_2$. An example of suitable Ti precursor is Ti(IV) methoxide (Ti $(OCH_3)_4$). A typical oxidant is water.

The deposition temperature during step d may range from 100 to 400° C., 150 to 350° C., or from 200 to 300° C.

In some embodiments, the thickness of the second layer of an oxide of Sr and Ti may be ranging from 5 nm to 25 nm, or 9 to 20 nm. 9 to 20 nm may correspond to 45 to 120 super-cycles of STO.

Step e of performing a second annealing may be performed at a temperature ranging from 400 to 800° C., from 500 to 700° C., or from 550 to 650° C. The duration of step e may range from 10 seconds to 3 minutes, from 20 seconds to 90 seconds, or from 40 seconds to 80 seconds. The ambient pressure during step e can be ranging from 1 to 20 atm, or at 1 atm. The atmosphere may be an inert atmosphere, such as a $N_2$ or Ar atmosphere.

In some embodiments, step e is performed at a temperature of from 550 to 650° C., for a duration of from 40 to 80 seconds, at a pressure of 1 atm, under an inert atmosphere.

A result of step e is the formation of the dielectric layer described above.

In some embodiments, the method may comprise a further step a', before step a, of providing the Ru layer, wherein step a' comprises:
 a'1. depositing by thermal atomic layer deposition or plasma-enhanced atomic layer deposition a TiN layer on a substrate, or providing a substrate having a $SiO_2$ layer thereon; and
 a'2. depositing by thermal atomic layer deposition the Ru layer on the TiN layer or on the $SiO_2$ layer.

The substrate may be as described in the first aspect.

In step a'1, the TiN layer is formed by thermal atomic layer deposition or plasma enhanced atomic layer deposition.

In step a'2, the ALD of Ru operates by reacting a Ru precursor (e.g EBECHRu) and an oxidant (e.g $O_2$) on either the TiN or the $SiO_2$ layer.

In some embodiments, step b and/or step d may further comprise forming by thermal atomic layer deposition a dopant oxide layer interjected in, respectively, the first layer of oxide of Sr and Ti and/or the second layer of oxide of Sr and Ti, wherein the dopant oxide layer is an oxide of a dopant selected from the group consisting of Ba, La, Ce, Pr, Nd, Pm, Sm, Eu, and Gd.

In other words, in some embodiments, step b may further comprise forming by thermal atomic layer deposition a dopant oxide layer interjected in the first layer of oxide of Sr and Ti, wherein the dopant oxide layer is an oxide of a dopant selected from the group consisting of Ba, La, Ce, Pr, Nd, Pm, Sm, Eu and Gd. In some embodiments, when a dopant oxide layer is deposited, 1 to 5 ALD cycles of dopant oxide deposition are performed.

Similarly, in some embodiments, step d may further comprise forming by thermal atomic layer deposition a dopant oxide layer interjected in the second layer of oxide of Sr and Ti, wherein the dopant oxide layer is an oxide of a dopant selected from the group consisting of Ba, La, Ce, Pr, Nd, Pm, Sm, Eu and Gd. In some embodiments, when a dopant oxide layer is deposited, 1 to 5 ALD cycles of dopant oxide deposition are performed.

Step b can optionally comprise interjecting during the deposition of the first layer up to 5 cycles of a metal oxide dopant selected from the group consisting of Ba, La, Ce, Pr, Nd, Pm, Sm, Eu, and Gd. In other words, up to 5 cycles of a metal oxide dopant selected from the group consisting of Ba, La, Ce, Pr, Nd, Pm, Sm, Eu, and Gd can be performed separately or in succession between deposition cycles of the oxide of Sr and Ti.

Step d can optionally comprise interjecting during the deposition of the first layer up to 5 cycles of a metal oxide dopant selected from the group consisting of Ba, La, Ce, Pr, Nd, Pm, Sm, Eu, and Gd. In other words, up to 5 cycles of a metal oxide dopant selected from the group consisting of Ba, La, Ce, Pr, Nd, Pm, Sm, Eu, and Gd can be performed separately or in succession between deposition cycles of the oxide of Sr and Ti.

In some embodiments, step b and/or step d may further comprise forming by thermal atomic layer deposition a layer of SrO or a layer of $TiO_2$ interjected in, respectively, the first layer of oxide of Sr and Ti and/or the second layer of oxide of Sr and Ti. A layer of SrO permits to increase the Sr composition of these layers. A layer of $TiO_2$ permits to increase the Ti composition of these layers.

Any feature of the third aspect may be as correspondingly described in the other aspects of the disclosed technology.

Example 1: Fabrication of MIM Capacitors

Planar (100×100) $\mu m^2$ MIM capacitors were fabricated via one mask process patterning of a metal top electrode (TE) on 300 mm diameter wafers. The complete stack consisted of a sequence of layers deposited as such: 15 nm ALD TiN+5 nm ALD Ru bottom electrode (BE), followed by 9-14 nm ALD STO as dielectric and 5 nm Ru+35 nm TiN as TE. These stacks will be called SRT stacks hereafter. For comparison, stacks without the 5 nm Ru BE layer were also fabricated, which will be called ST stacks hereafter. The STO films were deposited in a two-step process: firstly, a Sr-rich STO seed layer was deposited on the Ru BE. Then, a rapid thermal annealing (RTA) was performed. It induced the formation of an interfacial phase composed of one or more oxide of Sr and Ru (the SRO interlayer). This RTA step may further allow to create sufficiently small grain size and avoid microcrack defects. Then, a second (Ti-rich) STO layer was deposited, and the resulting stack was submitted to a crystallization anneal performed at 600° C. for 1 min in $N_2$. During the second anneal, the inter-diffusion of the two STO layers and the crystallization of a STO layer with a final composition of ~48 at. % Sr occurred. After deposition of the Ru+TiN TE, the stacks were patterned, and electrical characterizations were performed. The EOT values were extracted at 0V and room temperature from the capacitance-voltage (C-V) curves measured at 10 kHz, while the leakage was measured at ±1V using a delay time of 0.1 s.

Example 2: Physical Properties of the Dielectric Layer Obtained in Example 1

Figure 3:
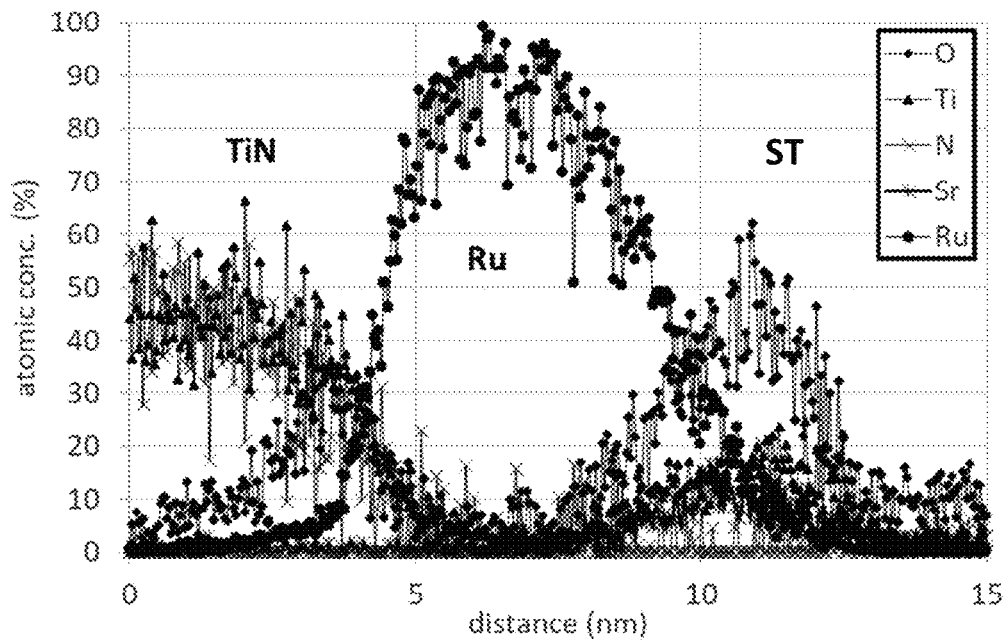
FIG. 3 is a graph showing the elemental depth profile obtained by EDS of an embodiment of the disclosed technology.
Figure 4:
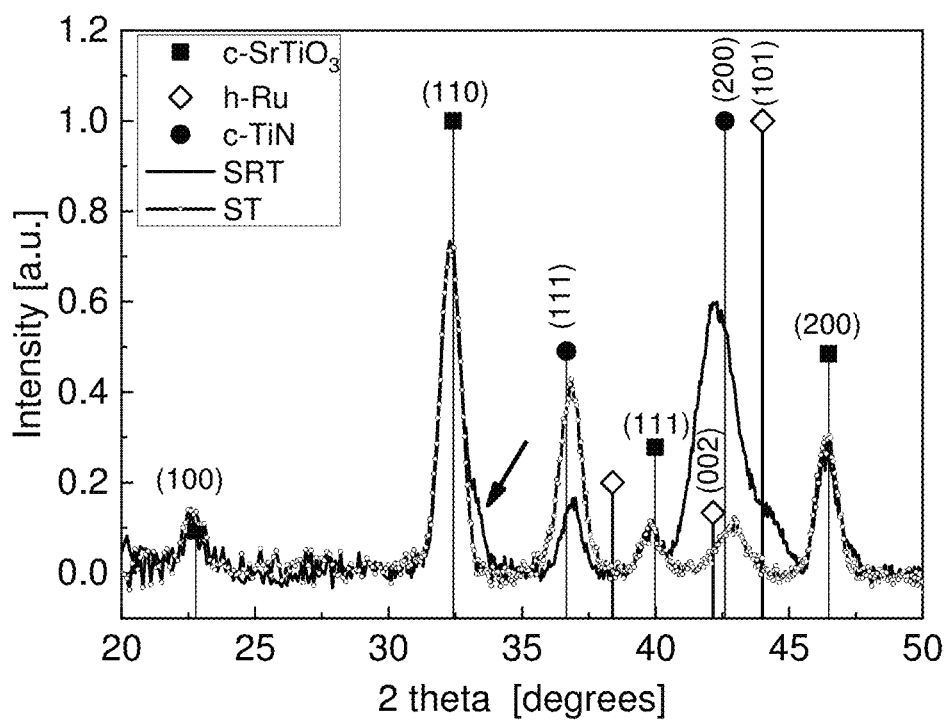
FIG. 4 is a graph showing the GIXRD diagram obtained for an embodiment of the disclosed technology and for a comparative example.
Figure 5:
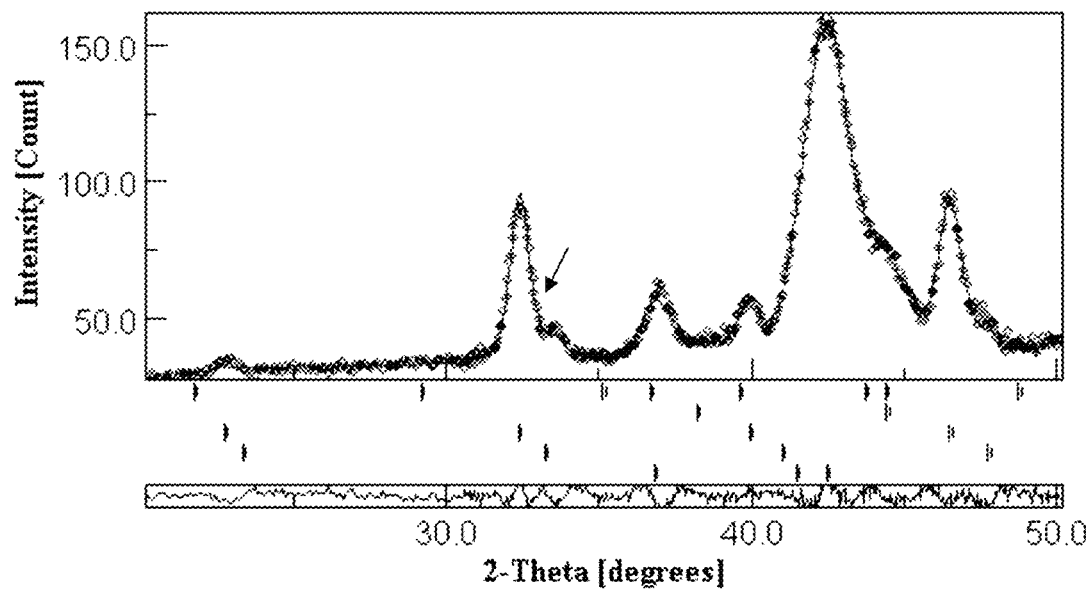
FIG. 5 is a graph showing the GIXRD experimental points, a theoretical fit thereof, and their differences for an embodiment of the disclosed technology.
Figure 6:
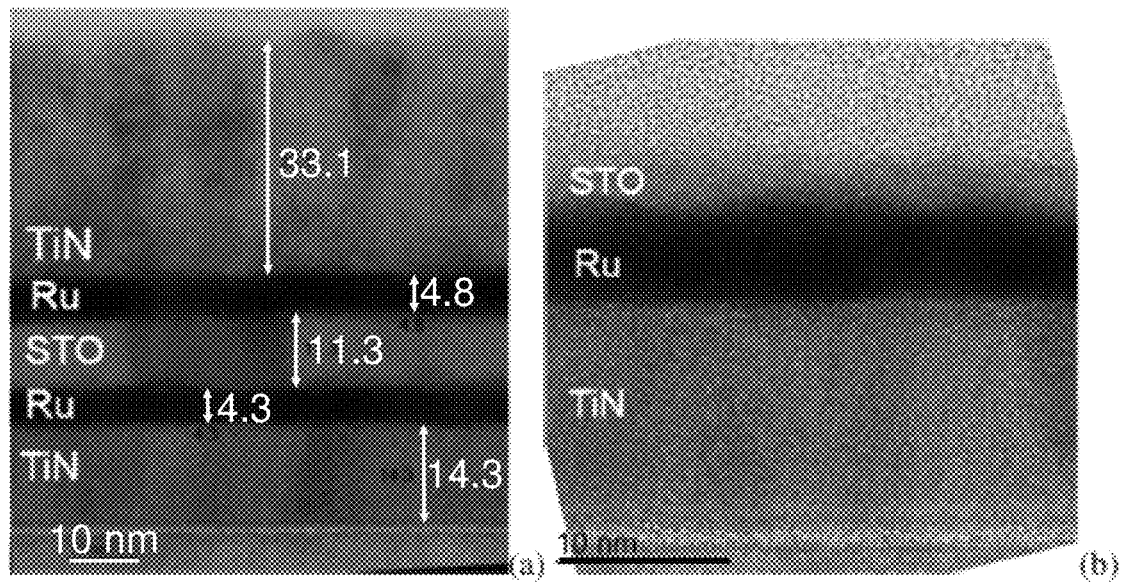
FIG. 6 shows cross-sectional TEM images of a capacitor according to an embodiment of the disclosed technology (PEALD TiN/Ru/STO/Ru/TiN; left) and of the annealed STO layer obtained after step c of an embodiment of the second aspect of the disclosed technology (right).

Physical properties were assessed after the post-deposition anneal at 600° C. The thickness of the BE TiN, BE Ru, ALD STO, TE Ru, and TE TiN layers was evaluated via X-ray reflectometry (XRR) to be, respectively, 14.3 nm, 4.3 nm, 11.3 nm, 4.8 nm, and 33.1 nm (see FIG. 6). An elemental depth profile was obtained by energy dispersive X-ray spectroscopy (EDS, see FIG. 3). From this profile, some intermixing between Ru and STO could be deduced at their interface. Noteworthy is the comparatively gentler slope of the Ru profile toward longer distances from the top surface of the assembly than toward shorter distances. This is indicative of the interfacial interaction between the bottom Ru electrode layer and the STO layer and it suggests the presence of a very thin Sr Ru oxide templating layer. The grazing incidence X-ray diffraction (GIXRD) diagram of the STO layer exhibited the well-known cubic structure of the perovskite both for SRT and ST stacks (see FIG. 4). One notable difference between the two diagrams is the presence of a shoulder with low intensity at ~33.0° for the SRT stack (see arrow in FIG. 4). Another notable difference is the presence of the (0 0 2) Ru diffraction line for SRT and its absence for ST. One can observe that for SRT the intensity of the (0 0 2) diffraction line is greater than the intensity of the (1 0 1) diffraction line. From Rietveld refinements performed according to L. Lutterotti et al (J. Appl. Cryst. Pp. 246-252, 1990) fitting procedure, the best model describing the SRT stack contains a comparatively small amount of trigonal $SrRu_2O_6$ and monoclinic $Sr_2Ru_3O_{10}$ next to the cubic $SrRuO_3$ (see shoulder pointed toward by the arrow in FIG. 5), next to the expected phases of cubic $SrTiO_3$, hexagonal Ru and cubic TiN (see FIG. 5). FIG. 5 shows the SRT experimental data (circles) and fit (line) with their difference (residual, line below). The fitting parameters (Rwp=3.13% and sigma of 0.69) showed a very good estimation of the phases present in the system. The calculated lattice parameter of $SrTiO_3$ is 3.888 Å, in agreement with the composition, while the adjacent templating layer of cubic $SrRuO_3$ has a parameter of 3.838 Å. Although no distinct phase corresponding to the interlayer could be evidenced neither by TEM imaging of the SRT capacitor TiN/Ru/STO/Ru/TiN/Si (FIG. 4a) nor for that of STO seed layer on Ru (FIG. 4b) imaged directly after step c.

Example 3: Electrical Results and Design Considerations

Figure 7:
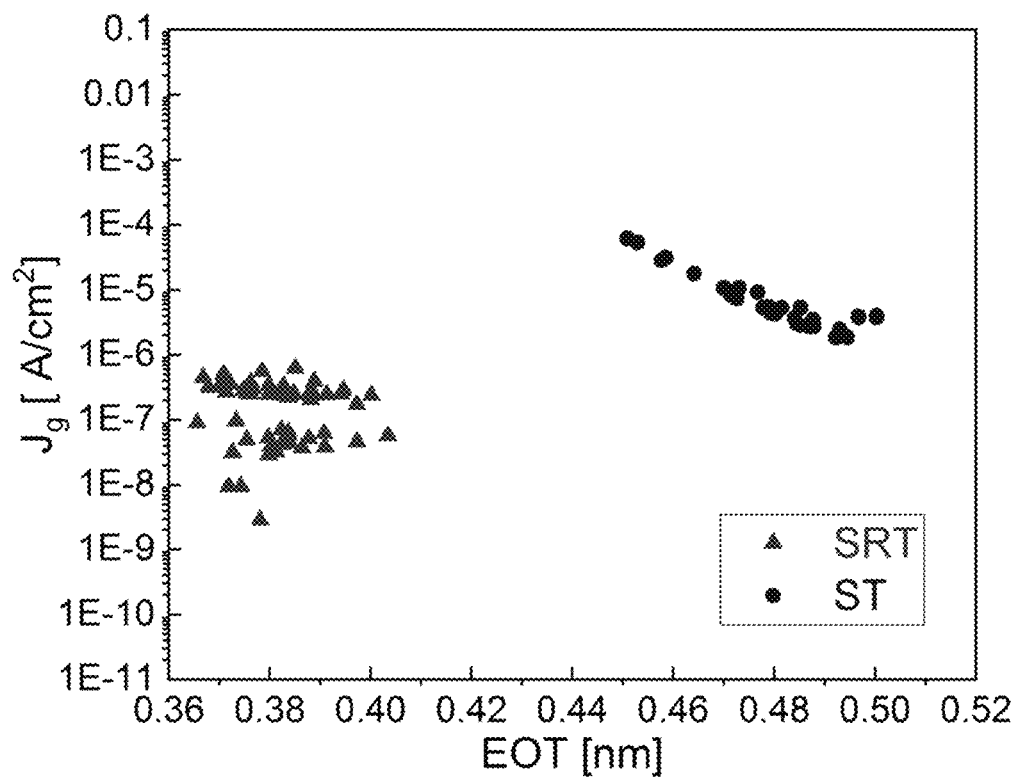
FIG. 7 is a graph showing Jg at +1V versus EOT distribution across the 300 mm wafer area in an embodiment of the disclosed technology (triangles) and for a comparative example (discs).
Figure 8:
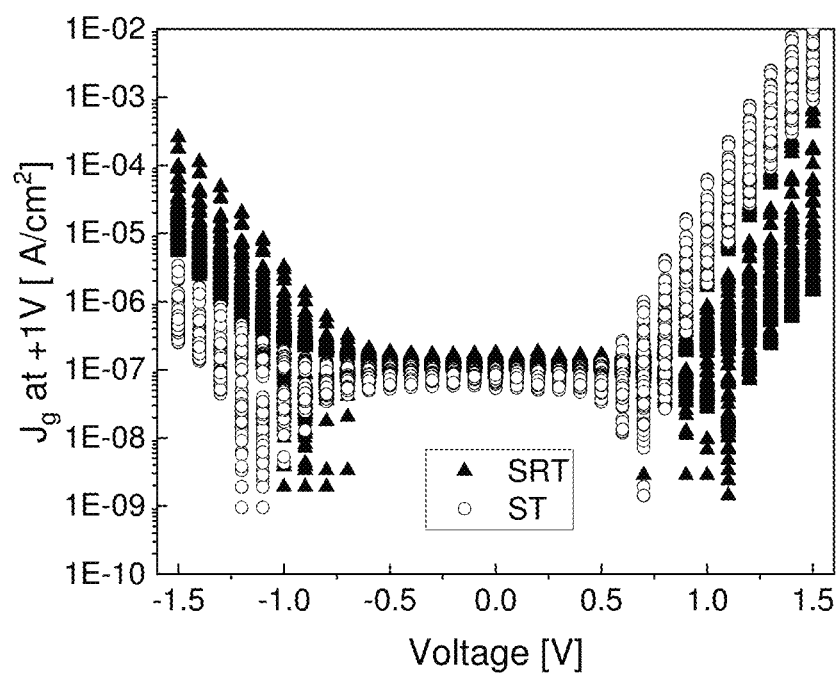
FIG. 8 is a graph showing the leakage versus the voltage for an embodiment of the disclosed technology (triangles) and for a comparative example (discs).
Figure 9:
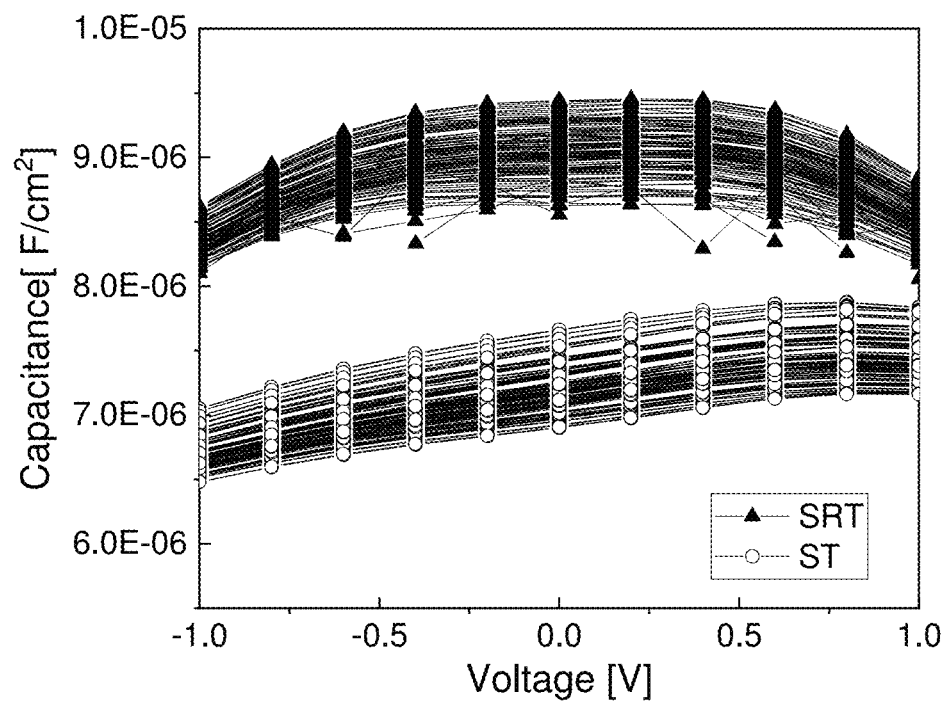
FIG. 9 is a graph showing the capacitance versus the voltage for an embodiment of the disclosed technology (triangles) and for a comparative example (discs).

The EOT vs Jg extracted at +1V (FIG. 7), together with leakage-voltage (FIG. 8) and capacitance-voltage (FIG. 9) results obtained for SRT and ST capacitors all over the 300 mm wafer are shown. The STO atomic composition is the same for both SRT and ST capacitors. Although the STO layer thickness is ~11 nm and ~10 nm for these SRT and ST stacks, respectively, substantially lower EOT is obtained for SRT capacitors. The difference in thickness is due to a slightly lower growth rate of STO on TiN as compared to Ru substrate. An effective dielectric constant value $k_{eff}$ of about 118 was extracted for SRT while a $k_{eff}$ of about 80 was extracted for ST stacks. A map (not depicted) of a wafer covered with a structure according to an embodiment of the disclosed technology showing the EOT distribution at different locations of the wafer. It indicated an excellent within-wafer (WIW) uniformity of EOT, and Jg, resulting in marginal $k_{eff}$ variations in the range 116-119 attributed to slight physical thickness variations in the range of ±0.2 nm. Also noteworthy is that higher EOT-performance wafer locations (NE) exhibited the lowest leakage. This can be seen in the table below where five locations of that map are tabulated.

| Position | EOT[nm] | Jg at +1 V(A/cm$^2$) | C(F/cm$^2$) |
|---|---|---|---|
| NE | 0.374 | <1E-07 | 9.2E-06 |
| SE | 0.376 | 3.8E-07 | 9.2E-06 |
| C  | 0.381 | 2.5E-07 | 9.1E-06 |
| SW | 0.386 | <1E-07 | 8.9E-06 |
| NW | 0.388 | 2.5E-07 | 8.9E-06 |

Figure 10:
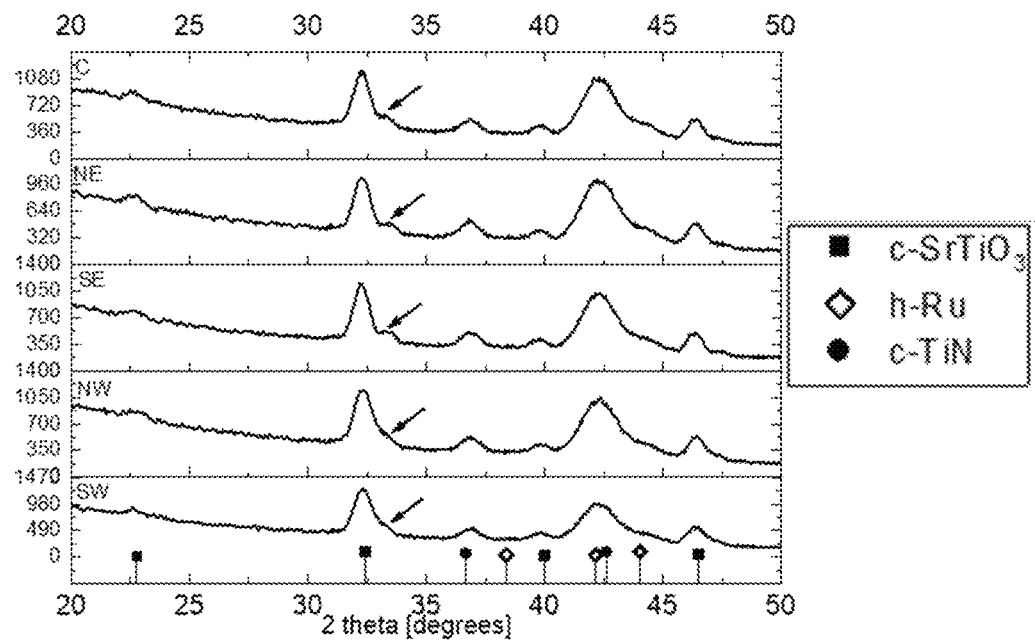
FIG. 10 shows GIXRD spectra recorded after step e for 5 positions indicated by dots in FIG. 10 (C, NE, SE, NW, and SW).
Figure 11:
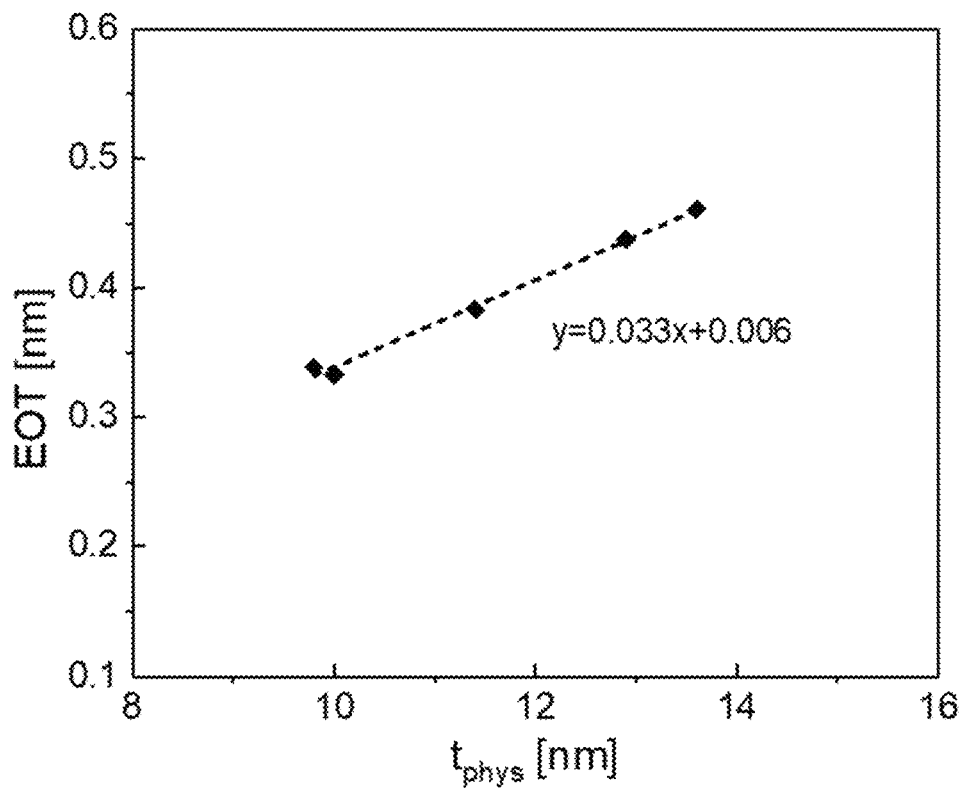
FIG. 11 is a graph of the EOT obtained for various thickness of dielectric layer in some embodiments of the disclosed technology.
Figure 12:
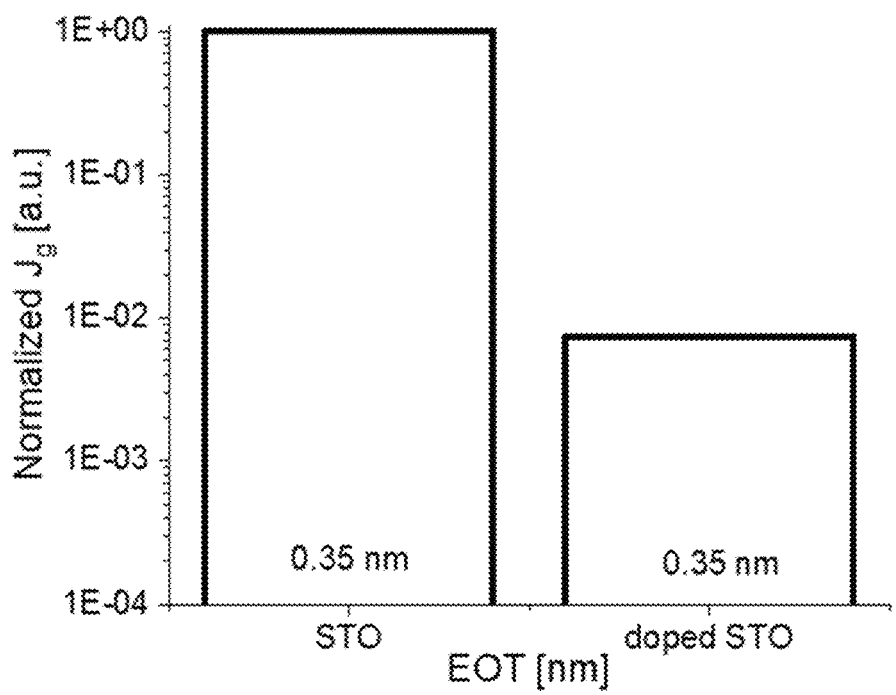
FIG. 12 is a graph showing the extent of the leakage at a fixed EOT; the left bar is the normalized leakage obtained by an undoped dielectric according to an embodiment of the disclosed technology; the right bar is the leakage obtained by doping that dielectric layer with a trivalent element.

Concomitantly, the better developed SRO-induced XRD shoulder in the NE area (FIG. 10) indicates that the SRO templating benefits not only $k_{eff}$, but also Jg. To confirm this excellent interfacial quality, we measured the EOT of SRT capacitors having varied STO thicknesses and we extracted the bulk-k value ($k_{bulk}$) from the slope of EOT data vs. STO thickness (FIG. 11). We obtained $k_{bulk} \sim k_{eff} \sim 118$, which means that the bulk dielectric properties of STO are not altered by the interface with the Ru BE and are fully sensed by C-V characterization. Hence, further improvement of STO bulk dielectric performances will be entirely exploited as capacitor signal in DRAM devices. FIG. 12 shows the further leakage reduction of SRT capacitors of about two orders of magnitude obtained by trivalent-element doping of the 10 nm thick STO films, with EOT kept constant to 0.35 nm, which could allow to further reduce the thickness below 10 nm. Doping solutions also exist to boost $k_{bulk}$ up to ~200 without the parasitic impact of low interface quality. Based on these results and projected progress the further downscaling of DRAM technology from D18 may consider a cell design move from the cup- to the pillar-type scheme. The former is at reach considering high quality bulk properties of STO, while the latter is obtainable through Jg reduction by means of doping, as shown in FIG. 12.

Example 4: Characterization of the Ru Layer

Figure 13:
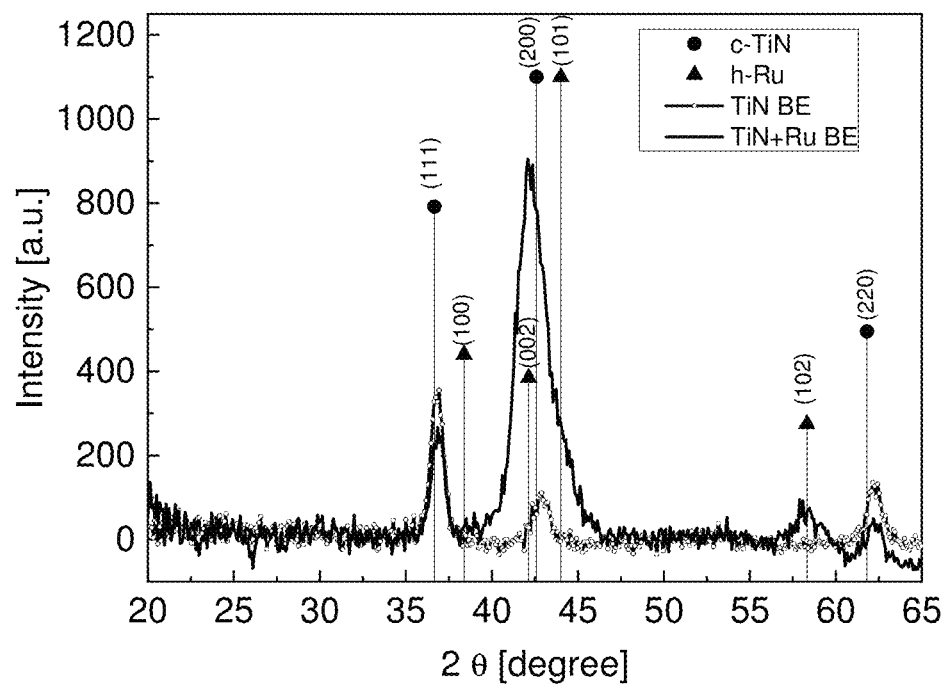
FIG. 13 shows GIXRD spectra recorded after step a'1 and after step a'2 in some embodiments of the disclosed technology.
Figure 14:
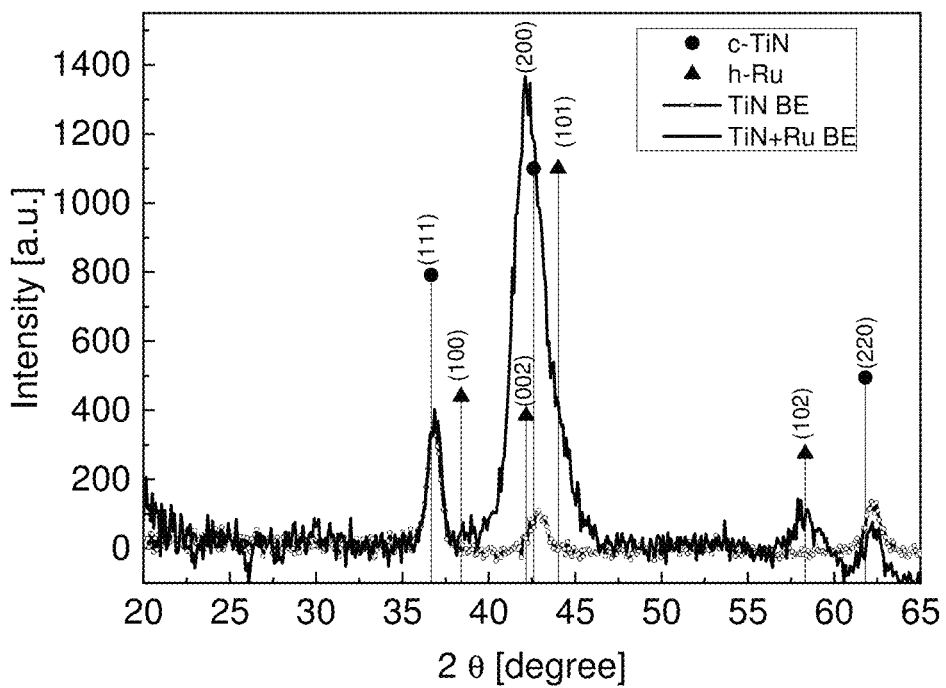
FIG. 14 shows the spectra of FIG. 13 after normalization.
Figure 15:
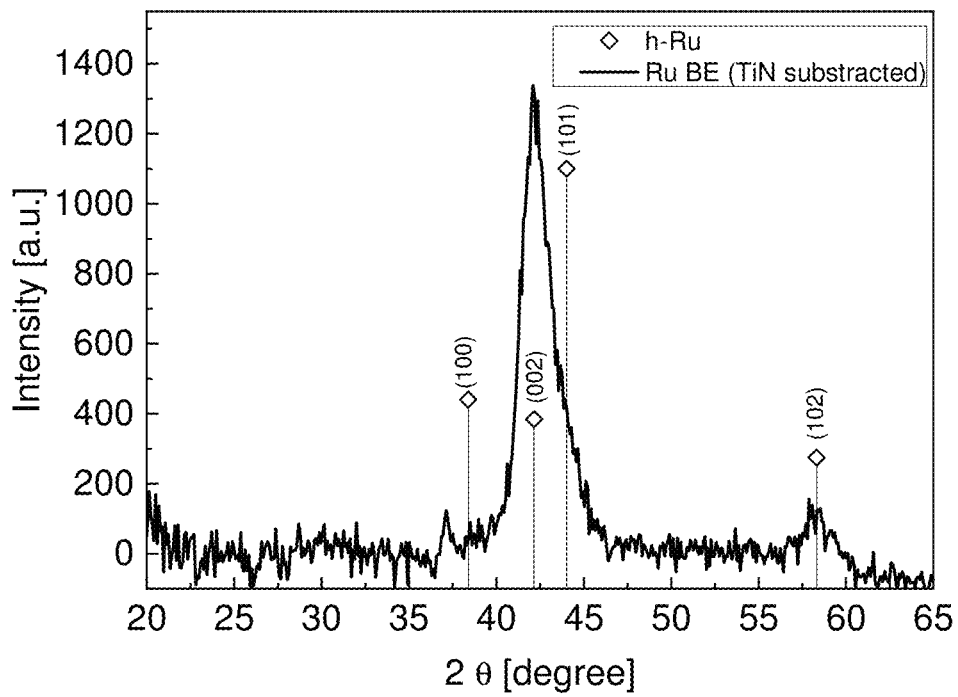
FIG. 15 shows the spectra of FIG. 14 after subtraction of the TiN spectrum from the TiN+Ru spectrum.

We now refer to FIGS. 13, 14 and 15. To determine the relative intensities of the (0 0 2) peak and of the (1 0 1) peak in the Ru layer, a first GIXRD spectrum (FIG. 13, lines with white dots) was taken for the PEALD TiN layer before the Ru layer was grown thereon. A second GIXRD spectrum (FIG. 13, plain line) was taken for the assembly PEALD TiN layer/Ru after that Ru had been grown on the TiN layer but before the deposition of any further layer thereon. Both spectra were then normalized (FIG. 14) by setting to a same intensity the (1 1 1) peak characteristic of the TiN. The first spectrum was then subtracted from the second spectrum (FIG. 15). The intensities of the first peak (42,2°) corresponding to a diffracting plane of Miller indices (0 0 2) and of the second peak (44,0°) corresponding to a diffracting plane of Miller indices (1 0 1) were then compared. A higher intensity was observed for the (0 0 2) peak than for the (1 0 1) peak (which was too small to be clearly distinguishable).

Since the contribution of the TiN spectrum to the Ru/TiN spectrum is negligible in the region of interest, the subtraction step appears not necessary and a direct comparison of the intensities of the first peak and of the second peak could have been performed directly on the Ru/TiN spectrum of FIG. 13. This is what has been done for FIG. 16 where Ru/PVD TiN, Ru/ALD TiN, and Ru/PEALD TiN are compared.

Figure 16:
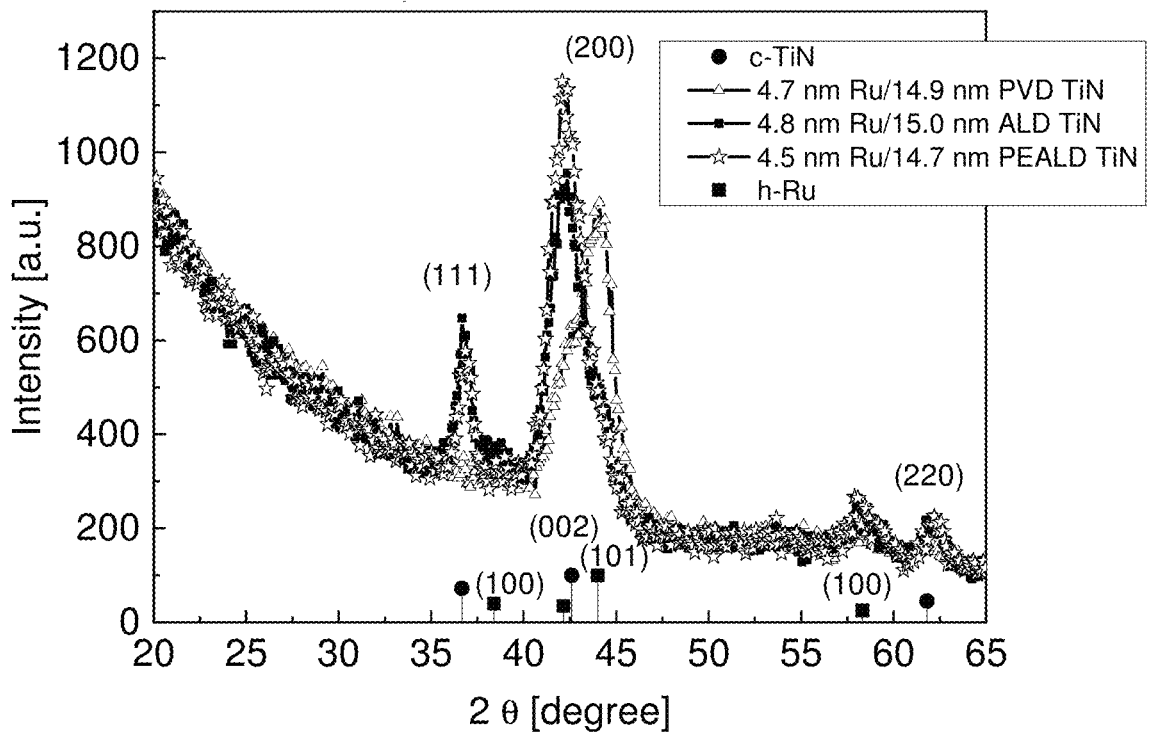
FIG. 16 shows GIXRD spectra of Ru layers according to the disclosed technology (on ALD TiN or on PEALD TiN) or according to the prior art (on PVD TiN).

This comparison of the first and second peak performed on a Ru layer deposited on a TiN layer deposited by physical vapor deposition instead of PEALD lead to a lower intensity for the (0 0 2) peak than for the (1 0 1) peak (see FIG. 16, triangles).

FIG. 16 shows GIXRD spectra of Ru layers according to the disclosed technology (on ALD TiN [squares] or on PEALD TiN [stars]) or according to the prior art (on PVD TiN [triangles]). The intensity of the peak corresponding to the diffracting plane of Miller indices (0 0 2) is larger than the intensity of the peak corresponding to the diffracting plane of Miller indices (101) in the case of the disclosed technology (where the second peak is not even clearly visible) but not in the case of the prior art.

Example 5: Structures of Cup-Shaped Capacitors and Pillar-Shaped Capacitor

FIG. 1 is a schematic view including a vertical cross-section of double-sided cup type (a) and pillar-type (b) DRAM capacitor design.

Figure 2:
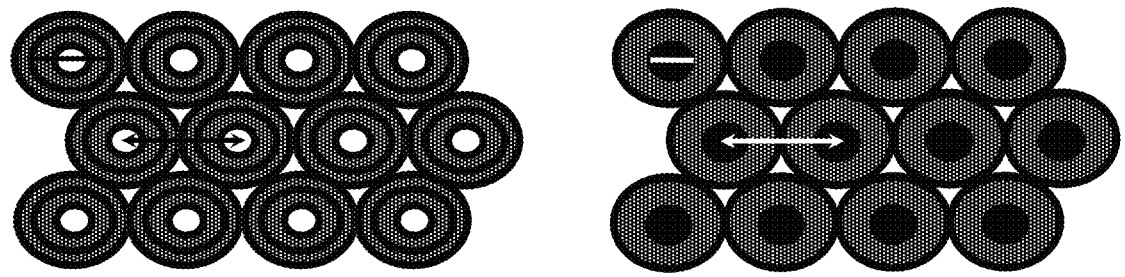
FIG. 2 is a horizontal cross-section through double-side cup-type (left) and pillar-type (right) capacitor designs.

FIG. 2 is a horizontal cross-section through double-side cup type (left) and pillar-type (right) capacitor designs. Visible are the electrodes (black), the dielectrics (pattern), the pitch (double arrows), and the critical dimension (CD, horizontal lines).

It is to be understood that although preferred embodiments, specific constructions and configurations, as well as materials, have been discussed herein for devices according to the present invention, various changes or modifications in form and detail may be made without departing from the scope of this invention. Steps may be added or deleted to methods described within the scope of the present invention.

What is claimed is:

1. A structure for use in a metal-insulator-metal capacitor, the structure comprising:
   a bottom electrode formed of a Ru layer, the Ru layer having a top surface characterized by a grazing incidence X-ray diffraction spectrum comprising a first intensity and a second intensity, wherein the first intensity corresponds to a diffracting plane of Miller indices (0 0 2) and the second intensity corresponds to a diffracting plane of Miller indices (1 0 1), and wherein the first intensity is larger than the second intensity;
   an interlayer arranged on a top surface of the Ru layer, the interlayer being formed of an oxide of Sr and Ru having a cubic lattice structure; and
   a dielectric layer on the interlayer, the dielectric layer being formed of an oxide of Sr and Ti having a cubic lattice structure.

2. The structure according to claim 1, further comprising a TiN layer or a SiO$_2$ layer configured to support the Ru layer.

3. The structure according to claim 2, wherein the TiN layer has internal tensile strain.

4. The structure according to claim 2, wherein the dielectric layer comprises one or more dopants selected from the group consisting of Ba, La, Ce, Pr, Nd, Pm, Sm, Eu and Gd.

5. A metal-insulator-metal capacitor, comprising:
   the structure according to claim 2; and
   a top electrode on the dielectric layer, the top electrode comprising a Ru layer and/or a TiN layer.

6. A metal-insulator-metal capacitor, comprising:
   the structure according to claim 3; and
   a top electrode on the dielectric layer, the top electrode comprising a Ru layer and/or a TiN layer.

7. The structure according to claim 1, wherein the dielectric layer has a thickness of 20 nm or lower, 16 nm or lower, or 12 nm or lower.

8. A metal-insulator-metal capacitor, comprising:
   the structure according to claim 7; and
   a top electrode on the dielectric layer, the top electrode comprising a Ru layer and/or a TiN layer.

9. The structure according to claim 1, wherein the dielectric layer comprises one or more dopants selected from the group consisting of Ba, La, Ce, Pr, Nd, Pm, Sm, Eu and Gd.

10. A metal-insulator-metal capacitor, comprising:
    the structure according to claim 9; and
    a top electrode on the dielectric layer, the top electrode comprising a Ru layer and/or a TiN layer.

11. A metal-insulator-metal capacitor, comprising:
    the structure according to claim 1; and
    a top electrode on the dielectric layer, the top electrode comprising a Ru layer and/or a TiN layer.

12. The metal-insulator-metal capacitor according to claim 11, being further configured to form a pillar-type dynamic random-access memory capacitor.

13. A method of forming the structure according to claim 1, comprising:
    depositing, by thermal atomic layer deposition, a TiO$_2$ layer on a Ru layer, the Ru layer having a top surface characterized by a grazing incidence X-ray diffraction spectrum comprising a first intensity and a second intensity, wherein the first intensity corresponds to a diffracting plane of Miller indices (0 0 2) and the second intensity corresponds to a diffracting plane of Miller indices (1 0 1), and wherein the first intensity is larger than the second intensity;
    depositing on the TiO$_2$ layer, by thermal atomic layer deposition, a first layer of an oxide of Sr and Ti, using a Sr:Ti cycle ratio ranging from 3:1 to 5:1;
    performing a first annealing to form an interlayer;
    depositing on the interlayer, by thermal atomic layer deposition, a second layer of an oxide of Sr and Ti, using a Sr:Ti cycle ratio ranging from 1.5:1 to 0.5:1; and
    performing a second annealing to form a dielectric layer.

14. The method according to claim 13, wherein the TiO$_2$ layer has a thickness ranging from 0.2 to 0.5 nm, or ranging from 0.3 to 0.4 nm.

15. The method according to claim 8, wherein the first layer of an oxide of Sr and Ti has a thickness ranging from 0.5 to 3 nm, or ranging from 0.6 to 2 nm.

16. The method according to claim 13, wherein the first annealing is a rapid thermal annealing.

17. The method according to claim 13, further comprising providing the Ru layer by:
    depositing a TiN layer on a substrate by thermal atomic layer deposition or plasma-enhanced atomic layer deposition, or providing a substrate having a SiO$_2$ layer thereon; and
    depositing, by thermal atomic layer deposition, the Ru layer on the TiN layer or on the SiO$_2$ layer.

18. The method according to claim 13, wherein depositing the first layer further comprises forming, by thermal atomic layer deposition, a dopant oxide layer interjected in the first layer, the dopant oxide layer being an oxide of a dopant selected from the group consisting of Ba, La, Ce, Pr, Nd, Pm, Sm, Eu and Gd.

19. The method according to claim 13, wherein depositing the second layer further comprises forming, by thermal atomic layer deposition, a dopant oxide layer interjected in the second layer, the dopant oxide layer being an oxide of a dopant selected from the group consisting of Ba, La, Ce, Pr, Nd, Pm, Sm, Eu and Gd.

20. The method according to claim 13, wherein depositing the first layer and/or depositing the second layer further comprise forming, by thermal atomic layer deposition, a layer of SrO interjected in the first layer and/or the second layer.

* * * * *